(12) United States Patent
Li et al.

(10) Patent No.: US 11,685,059 B2
(45) Date of Patent: Jun. 27, 2023

(54) TURNTABLE MECHANISM

(71) Applicant: Zhejiang University, Zhejiang (CN)

(72) Inventors: Xin Li, Zhejiang (CN); Xubo Yu, Zhejiang (CN); Jianghong Zhao, Zhejiang (CN)

(73) Assignee: Zhejiang University, Hangzhou (CN)

( * ) Notice: Subject to any disclaimer, the term of this patent is extended or adjusted under 35 U.S.C. 154(b) by 67 days.

(21) Appl. No.: 17/170,723

(22) Filed: Feb. 8, 2021

(65) Prior Publication Data
US 2021/0252653 A1  Aug. 19, 2021

(51) Int. Cl.
*B25J 15/06* (2006.01)
*H01L 21/683* (2006.01)
*B25B 11/00* (2006.01)
*B65G 47/91* (2006.01)

(52) U.S. Cl.
CPC ......... *B25J 15/0616* (2013.01); *B25B 11/005* (2013.01); *B65G 47/91* (2013.01); *B65G 47/911* (2013.01); *H01L 21/6838* (2013.01)

(58) Field of Classification Search
CPC ............ B25J 15/0616; H01L 21/6838; B25B 11/005; B65G 47/911
USPC ....................................... 294/64.3
See application file for complete search history.

(56) References Cited

U.S. PATENT DOCUMENTS

| | | | |
|---|---|---|---|
| 4,603,867 A * | 8/1986 | Babb ................... | B23B 31/307 451/388 |
| 6,095,582 A * | 8/2000 | Siniaguine ........... | H01L 21/6838 414/941 |
| 6,321,463 B1 * | 11/2001 | Shinozaki ........... | H01L 21/6704 34/448 |
| 7,396,022 B1 * | 7/2008 | Moghadam .......... | B23B 31/307 269/21 |
| 9,339,936 B2 * | 5/2016 | Kearney .............. | B65H 3/0816 |
| 9,653,338 B2 * | 5/2017 | Huang ............... | H01L 21/68728 |
| 9,911,640 B2 * | 3/2018 | Kesil .................. | H01L 21/68707 |
| 2008/0011334 A1 * | 1/2008 | Rye ................... | H01L 21/68735 134/95.1 |
| 2014/0363275 A1 * | 12/2014 | Li ......................... | F04D 17/10 415/118 |
| 2015/0371886 A1 * | 12/2015 | Sato ..................... | B25J 11/0095 294/81.5 |

(Continued)

FOREIGN PATENT DOCUMENTS

CN    103496589 A    1/2014
JP    2009298331 A    12/2009

*Primary Examiner* — Dean J Kramer
(74) *Attorney, Agent, or Firm* — McCoy Russell LLP

(57) ABSTRACT

The present invention relates to a turntable mechanism, including a flat plate and a rotating device for driving the flat plate to rotate, where the flat plate rotates to generate a negative pressure between a lower surface of the flat plate and a surface of an adsorbed object, the flat plate and the adsorbed object adhere together by an adsorption force generated by the negative pressure, and in this case, a gap is kept between the lower surface of the flat plate and the surface of the adsorbed object. In the present invention, a continuous, consistent, and stable fluid film is formed between the turntable and the adsorbed object, and a secondary flow is not easily generated, thereby ensuring that the adsorption force between the rotating flat plate and the adsorbed object is more stable.

6 Claims, 2 Drawing Sheets

(56) References Cited

U.S. PATENT DOCUMENTS

2019/0252233 A1* 8/2019 Kim .................. H01L 21/00
2019/0371646 A1* 12/2019 Liao .................. B25B 11/005

* cited by examiner

TURNTABLE MECHANISM

CROSS REFERENCE TO RELATED APPLICATION

The present application claims priority to Chinese Patent Application No. 202010098130.9 filed on Feb. 18, 2020. The entire contents of the above-listed application is hereby incorporated by reference for all purposes.

TECHNICAL FIELD

The present invention relates to the field of negative pressure adsorption technologies, and, in particular, to a turntable mechanism.

BACKGROUND AND SUMMARY

An adsorption technology is a widely used basic technology. A typical application scenario is to adsorb and move workpieces on an automated production line. For example, Chinese patent No. CN201310366707.X discloses an object adsorption device, including a housing, where fan blades are arranged inside the housing. A motor drives the fan blades to rotate, forming a rotating air flow in the housing. A concave negative pressure distribution is formed inside the housing under the action of a centrifugal force of the rotating air flow. Therefore, the device can adsorb workpieces. Chinese patent No. JP2009298331A discloses a non-contact adsorption device. The device is provided with a suction hole in the housing, sucks in air and discharges the air from a lower end surface of the housing, so as to adsorb a workpiece and maintain a certain distance from the workpiece to implement non-contact adsorption. However, the above two patented technologies have the following disadvantages:

(1) The rotating air flow formed by the air driven by the fan blades is a discontinuous rotating air flow. As shown in FIG. 1 (top sectional view), fan blades 1' rotate anticlockwise in a housing 2'. The speed of the air between the two fan blades 1' in a circumferential direction has a significant speed gradient, that is, the air next to a fan blade surface A and the fan blade keep the same speed. However, the air between the surface A and a surface B is not directly driven by the fan blades. In addition, the air is decelerated by the viscous effect of a stationary wall surface C of the housing 2', which causes the rotation speed of the air to gradually decrease from the surface A to the surface B. The inconsistency of the internal speed of the rotating air flow causes the negative pressure at the same radius position to also change in the rotation direction. Therefore, as the fan blades 1' rotate, the suction force on any area of the workpiece surface fluctuates periodically, which leads to serious vibration.

(2) The surface A, the surface B, the surface C, a top surface of the housing 2' and the surface of the adsorbed object (not shown in FIG. 1) are closed to form a space. This space is composed of a plurality of surfaces, including two moving surfaces (the surface A and the surface B) and three fixed surfaces (the surface C, the top surface of the housing 2', and the surface of the adsorbed object). The air flow in this space is a complicated flow with multi-interface constraints. Such a flow can easily form a secondary flow. The secondary flow will weaken the rotating flow, thereby weakening the negative pressure distribution and reducing the adsorption force.

The technical problem to be solved by the present invention is to provide a turntable mechanism, so that a continuous, consistent, and stable fluid film is formed between a turntable and an adsorbed object, and a secondary flow is not easily generated, thereby ensuring that an adsorption force between the turntable and the adsorbed object is more stable.

The present invention is implemented as follows: A turntable mechanism is provided, including a flat plate and a rotating device for driving the flat plate to rotate, where the flat plate rotates to generate a negative pressure between a lower surface of the flat plate and a surface of an adsorbed object, the flat plate and the adsorbed object adhere together by an adsorption force generated by the negative pressure, and in this case, a gap is kept between the lower surface of the flat plate and the surface of the adsorbed object.

Further, the turntable mechanism further includes an ejector rod, where the ejector rod is fixedly connected to the rotating device through a connecting piece, and a front end of the ejector rod extends to the surface of the adsorbed object and is in contact with the surface of the object, so that a gap is kept between the lower surface of the flat plate and the surface of the adsorbed object.

Further, the ejector rod is provided with a height adjustment device, and the height adjustment device can adjust a protruding position of the front end of the ejector rod, so as to adjust the size of the gap between the lower surface of the flat plate and the surface of the adsorbed object.

Further, the height adjustment device is a push rod device, where the push rod device is fixedly connected to the rotating device, and after the push rod device operates, the protruding position of the front end of the ejector rod is adjusted to adjust the size of the gap between the lower surface of the flat plate and the surface of the adsorbed object.

Further, the flat plate is provided with a through hole, where the through hole is connected to fluid at upper and lower sides of the flat plate.

Further, the rotating device includes a motor and a rotating shaft, where the rotating shaft is connected to the flat plate, and the motor drives the rotating shaft to drive the flat plate to rotate.

Compared with the prior art, the turntable mechanism according to the present invention includes a flat plate and a rotating device for driving the flat plate to rotate. The rotating flat plate drives a fluid film to rotate through fluid viscosity, so that a negative pressure is generated between a lower surface of the flat plate and a surface of an adsorbed object. Because the flat plate is a continuous surface, in the circumferential direction, the rotation state of the fluid in the fluid film is continuous and consistent, and the resulting negative pressure distribution and suction force are also continuous and stable. In addition, the fluid film is constrained only by the surface of the flat plate and the surface of the adsorbed object, the number of interfaces constraining fluid flow is small, the flow is a simple and stable flow, and a secondary flow is not generated easily.

DETAILED DESCRIPTION

To make the technical problems to be solved, technical solutions and beneficial effects of the present invention clearer, the following further describes the present invention in detail with reference to accompanying drawings and embodiments. It should be understood that the specific embodiments described herein are merely used to describe the present invention and are not intended to limit the present invention.

Figure 1:
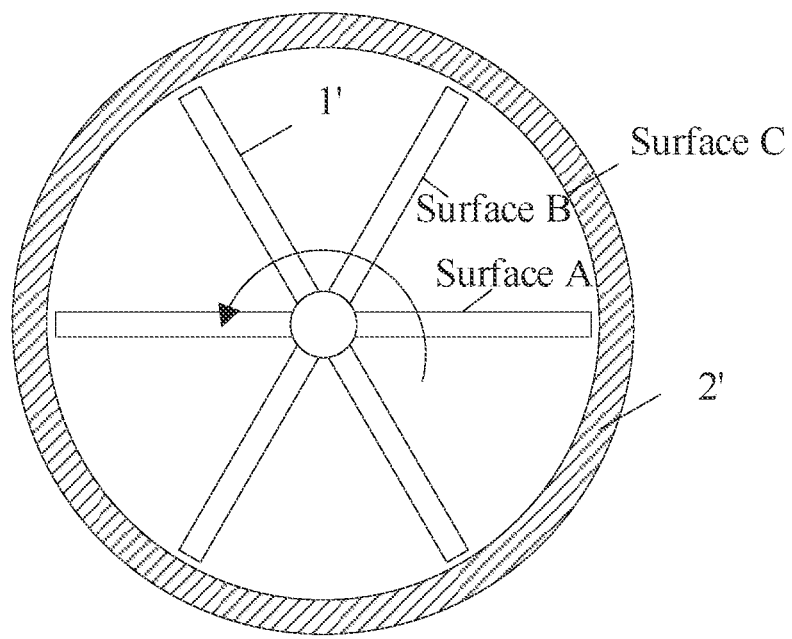
FIG. 1 is a top sectional view of an existing adsorption device.
Figure 2:
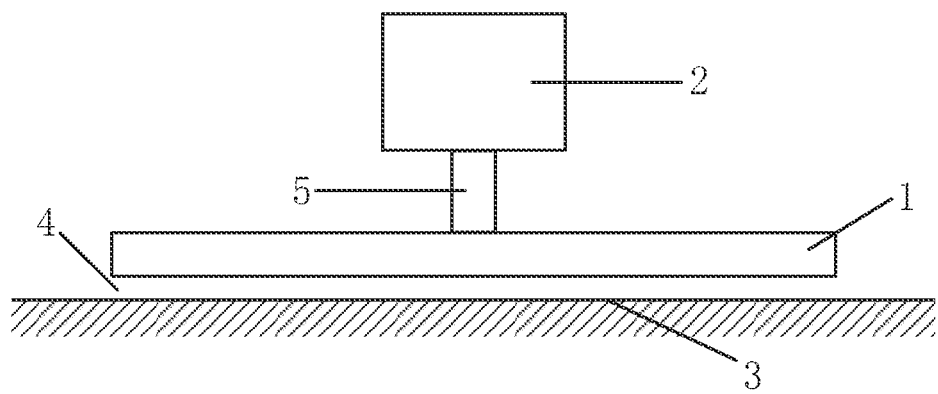
FIG. 2 is a schematic structural principle diagram of Embodiment 1 of a turntable mechanism according to the present invention.

Referring to FIG. 2, a turntable mechanism according to a preferred embodiment of the present invention includes a flat plate 1 and a rotating device 2 for driving the flat plate to rotate 1, where the flat plate 1 rotates to generate a negative pressure between a lower surface of the flat plate 1 and a surface of an adsorbed object 3, the flat plate 1 and the adsorbed object 3 adhere together by an adsorption force generated by the negative pressure, and in this case, a gap 4 is kept between the lower surface of the flat plate 1 and the surface of the adsorbed object 3.

The specific structure of the turntable mechanism according to the present invention is further described below with reference to specific embodiments.

Embodiment 1

This is a first embodiment of the turntable mechanism according to the present invention.

As shown in FIG. 2, the rotating device 2 is a motor, and the flat plate 1 is fixedly mounted on a motor shaft 5. The motor drives the flat plate 1 to rotate through the motor shaft 5. The adsorbed object 3 is disposed below the rotating flat plate 1. A certain distance is kept between the flat plate 1 and the surface of the adsorbed object 3 to form a fluid film. Taking an air environment as an example, the fluid film is an air film. The rotating flat plate 1 drives the air film below it to rotate under the action of the fluid viscosity of the air. A centrifugal force is generated inside the rotating air film, so that the air inside the air film is thrown out, thereby forming a negative pressure distribution between the flat plate 1 and the surface of the adsorbed object 3. The negative pressure distribution exerts a suction force between the flat plate 1 and the adsorbed object 3, so that the flat plate 1 and the adsorbed object 3 adhere together by an adsorption force generated by the negative pressure, and in this case, a gap 4 is kept between the lower surface of the flat plate 1 and the surface of the adsorbed object 3.

Embodiment 2

This is a second embodiment of the turntable mechanism according to the present invention. Based on further analysis of the structure of Embodiment 1, it can be seen that the flat plate 1 drives the fluid film to rotate through viscous effect, and the distance between the flat plate 1 and the surface of the adsorbed object 3 has a great impact on the viscous effect of the fluid. When the distance is small, the viscous effect is strong, and the rotation of the fluid film is more sufficient; or when the distance is large, the viscosity action is weak, and the rotation of the fluid film is weakened. A fluid film that fully rotates can form a lower negative pressure and a greater suction force, while a fluid film that does not fully rotate has a weaker negative pressure distribution and a weaker suction force. It can be seen that the adsorption force between the flat plate 1 and the surface of the adsorbed object 3 can be set by setting the distance between the two.

Figure 3:
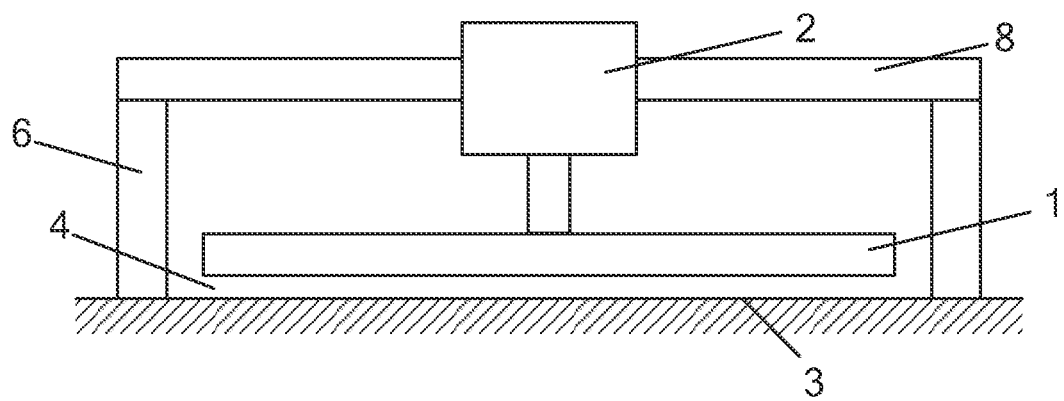
FIG. 3 is a schematic structural principle diagram of Embodiment 2 of the turntable mechanism according to the present invention.

As shown in FIG. 3, in this embodiment, several ejector rods 6 are added to the rotating device. The ejector rods 6 are fixedly connected to the rotating device 2. In this embodiment, the ejector rods 6 are fixedly connected to the rotating device 2 through a connecting piece 8. A front end of each of the ejector rods 6 is lower than a lower end face of the flat plate 1 and is in contact with the surface of the adsorbed object 3. The height difference between the front end of the ejector rod 6 and the flat plate 1 is the distance between the flat plate 1 and the surface of the adsorbed object 3. Therefore, the gap between the flat plate 1 and the surface of the adsorbed object 3 can be set by setting the length of the ejector rod 6. When the rotation speed of the flat plate 1 is constant, a greater suction force can be obtained by reducing the height difference between the front end of the ejector rod 6 and the lower surface of the flat plate 1, or the suction force is weakened by increasing the height difference between the front end of the ejector rod 6 and the lower surface of the flat plate 1.

Embodiment 3

This is a third embodiment of the turntable mechanism according to the present invention. A height adjustment device is added to the turntable mechanism on the basis of Embodiment 2. The height adjustment device is arranged on the ejector rod 6, and the size of the gap 4 between the lower surface of the flat plate 1 and the surface of the adsorbed object 3 is changed by setting the extension length of the ejector rod 6.

Figure 4:
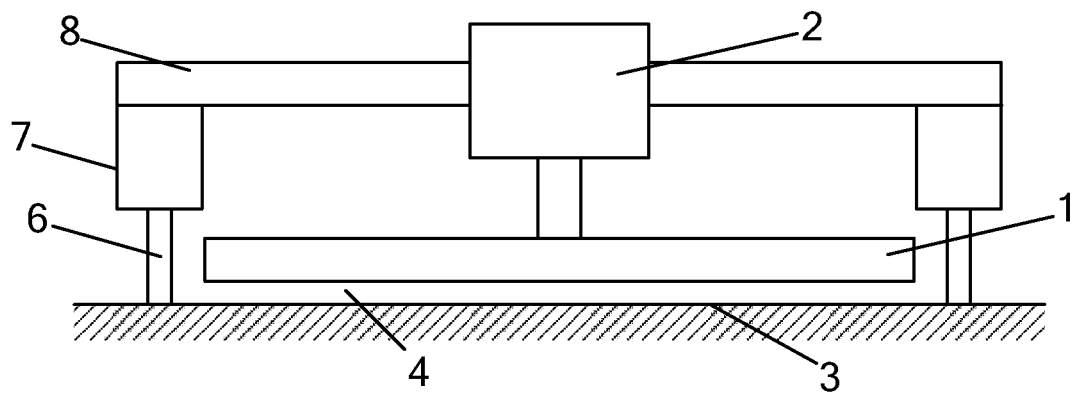
FIG. 4 is a schematic structural principle diagram of Embodiment 3 of the turntable mechanism according to the present invention.

As shown in FIG. 4, in this embodiment, the height adjustment device is formed by several push rod devices 7. The push rod devices 7 are each fixedly connected to the rotating device 2 through a connecting piece 8. The push rod device 7 adjusts the distance between the lower surface of the flat plate 1 and the surface of the adsorbed object 3 by adjusting the extension length of the ejector rod 6. The push rod device 7 can push the ejector rod 6 to move up and down. The push rod device 7 pushes the ejector rod 6 downward when the height difference between the front end of the ejector rod 6 and the lower surface of the flat plate 1 needs to be increased. The push rod device 7 pushes the ejector rod 6 upward when the height difference between the front end of the ejector rod 6 and the lower surface of the flat plate 1 needs to be reduced. In this way, the magnitude of the adsorption force between the flat plate 1 and the adsorbed object 3 is controlled.

Embodiment 4

This is a fourth embodiment of the turntable mechanism according to the present invention. When the surface of the adsorbed object 3 is a workpiece surface, the turntable mechanism according to Embodiment 1 is close to the workpiece and exerts an adsorption force on the workpiece. The workpiece is sucked up and approaches the rotating flat plate 1 under the action of the suction force. As the workpiece approaches the rotating flat plate 1, the air film between the flat plate 1 and the workpiece becomes thinner and the suction force increases, and the workpiece further approaches the rotating flat plate 1. Finally, the workpiece collides with the rotating flat plate 1, so that the workpiece and the turntable mechanism collide and are damaged.

Figure 5:
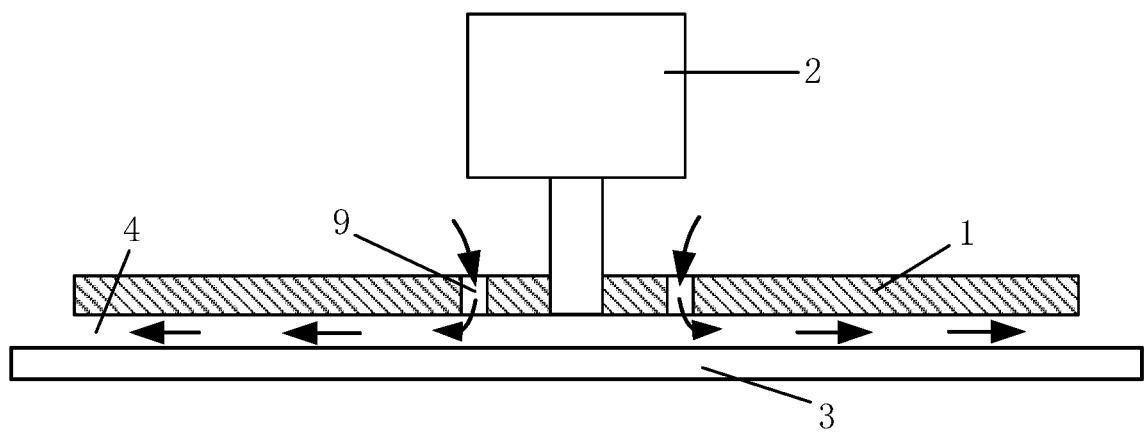
FIG. 5 is a schematic structural principle diagram of Embodiment 4 of the turntable mechanism according to the present invention.

In the sectional view of the flat plate 1 as shown in FIG. 5, to solve the above problems, some through holes 9 are formed in the flat plate 1. A negative pressure is formed between the flat plate 1 and the workpiece, and the negative pressure sucks in air through the through holes 9. The sucked air is driven by the rotating flat plate 1 to rotate together, and flows to the periphery of the flat plate under the action of the centrifugal force. As such, a radial gap flow from the through holes 9 to the periphery in the rotating air film is implemented. A positive pressure component is established through the viscous effect of the radial gap flow, and when the gap 4 is smaller, the viscous effect is stronger, and the positive pressure component is greater. The positive pressure component is superimposed on the negative pressure distribution of the rotating air film to weaken the negative pressure distribution and the suction force. In the process of adsorbing the workpiece, when the workpiece is close to the rotating flat plate 1, the gap 4 becomes smaller, the positive pressure component is increased, and the suction force is weakened, thereby preventing the workpiece from continuing to approach the rotating flat plate 1; when the workpiece is far away from the rotating flat plate 1, the gap 4 becomes larger, the positive pressure component becomes smaller, the weakening effect on the suction force is weakened, and the suction force prevents the workpiece from continuing to move away from the rotating flat plate 1. Under the combined action of the positive pressure component of the radial gap flow and the negative pressure of the rotating flow, the workpiece can be stably suspended below the rotating flat plate 1 and keep a certain distance from the rotating flat plate 1. The design of the through hole 9 can avoid the collision between the workpiece and the rotating flat plate 1, thereby implementing non-contact adsorption. The non-contact adsorption of this structure can be applied to the transportation of precision workpieces (semiconductor wafers, glass substrates, and the like), and can effectively avoid damage to surfaces of the precision workpieces.

In the above embodiments, air is used as a fluid medium for detailed description. The principles of the embodiments are applicable to all fluid media, such as water and oil. The above are only the preferred embodiments of the present invention, and are not intended to limit the present invention. Any modifications, equivalent replacements and improvements, and the like made within the spirit and principles of the present invention should fall within the protection scope of the present invention.

The invention claimed is:

1. A turntable mechanism, comprising a flat plate and a rotating device for driving the flat plate to rotate, wherein the flat plate rotates to generate a negative pressure between a lower surface of the flat plate and a surface of an adsorbed object, the flat plate and the adsorbed object adhere together by an adsorption force generated by the negative pressure, and in this case, a gap is kept between the lower surface of the flat plate and the surface of the adsorbed object;
    wherein the flat plate is provided with a through hole, and the through hole is connected to fluid at upper and lower sides of the flat plate,
    the turntable mechanism further comprising an ejector rod, wherein the ejector rod is fixedly connected to the rotating device through a connecting piece, and a front end of the ejector rod extends to the surface of the adsorbed object and is in contact with the surface of the adsorbed object, so that a gap is kept between the lower surface of the flat plate and the surface of the adsorbed object,
    wherein the ejector rod is provided with a height adjustment device, and the height adjustment device can adjust a protruding position of the front end of the ejector rod, so as to adjust the size of the gap between the lower surface of the flat plate and the surface of the adsorbed object.

2. The turntable mechanism according to claim 1, wherein the height adjustment device is a push rod device, which is fixedly connected to the rotating device, and after the push rod device operates, the protruding position of the front end of the ejector rod is adjusted to adjust the size of the gap between the lower surface of the flat plate and the surface of the adsorbed object.

3. The turntable mechanism according to claim 1, wherein the rotating device comprises a motor and a rotating shaft, the rotating shaft is connected to the flat plate, and the motor drives the rotating shaft to drive the flat plate to rotate.

4. A turntable mechanism, comprising a flat plate and a rotating device for driving the flat plate to rotate, wherein the flat plate rotates to generate a negative pressure between a lower surface of the flat plate and a surface of an adsorbed object, the flat plate and the adsorbed object adhere together by an adsorption force generated by the negative pressure, and in this case, a gap is kept between the lower surface of the flat plate and the surface of the adsorbed object;
    wherein the flat plate is provided with a through hole, and the through hole is connected to fluid at upper and lower sides of the flat plate, and
    wherein a height adjustment device is provided comprising a push rod device, which is fixedly connected to the rotating device, and after the push rod device operates, a protruding position of a front end of an ejector rod is adjusted to adjust the size of the gap between the lower surface of the flat plate and the surface of the adsorbed object.

5. The turntable mechanism according to claim 4, wherein the rotating device comprises a motor and a rotating shaft, the rotating shaft is connected to the flat plate, and the motor drives the rotating shaft to drive the flat plate to rotate.

6. A turntable mechanism, comprising a flat plate and a rotating device for driving the flat plate to rotate, the flat plate being provided with a through hole, wherein the through hole is connected to fluid at upper and lower sides of the flat plate, and wherein the flat plate rotates to generate a negative pressure between a lower surface of the flat plate and a surface of an adsorbed object, whereby the flat plate and the adsorbed object adhere toward one another by an adsorption force generated by the negative pressure, and in this case, a gap is kept between the lower surface of the flat plate and the surface of the adsorbed object such that all of the flat plate, when the flat plate is rotating, is not in contact with the surface of the adsorbed object.

* * * * *

UNITED STATES PATENT AND TRADEMARK OFFICE
CERTIFICATE OF CORRECTION

PATENT NO. : 11,685,059 B2
APPLICATION NO. : 17/170723
DATED : June 27, 2023
INVENTOR(S) : Xin Li, Xubo Yu and Jianghong Zhao It is certified that error appears in the above-identified patent and that said Letters Patent is hereby corrected as shown below:

On the Title Page

Insert:
--Foreign Application Priority Data
Feb 18, 2020 (CN)..........................202010098130.9--

Signed and Sealed this
Eighth Day of August, 2023

Katherine Kelly Vidal
*Director of the United States Patent and Trademark Office*